United States Patent [19]
Kato et al.

[11] Patent Number: 5,107,539
[45] Date of Patent: Apr. 21, 1992

[54] AUTOMATIC SOUND VOLUME CONTROLLER

[75] Inventors: Shinjiro Kato; Hisashi Kihara; Fumio Tamura; Shuichi Mori, all of Kawagoe, Japan

[73] Assignee: Pioneer Electronic Corporation, Tokyo, Japan

[21] Appl. No.: 542,037

[22] Filed: Jun. 22, 1990

[30] Foreign Application Priority Data

Sep. 1, 1989 [JP] Japan .................................. 1-226574

[51] Int. Cl.⁵ .............................................. H03G 3/20
[52] U.S. Cl. ........................................ 381/57; 381/86; 381/108
[58] Field of Search .................. 381/57, 86, 107, 56, 381/108

[56] References Cited

U.S. PATENT DOCUMENTS

| | | | |
|---|---|---|---|
| 4,254,303 | 3/1981 | Takizawa | 381/107 |
| 4,553,257 | 11/1985 | Mori et al. | 381/107 |
| 4,628,526 | 12/1986 | Germer | 381/108 |
| 4,694,497 | 9/1987 | Kasai et al. | 381/56 |

FOREIGN PATENT DOCUMENTS 2170666  8/1986  United Kingdom ............... 381/57

Primary Examiner—Forester W. Isen
Assistant Examiner—Sylvia Chen
Attorney, Agent, or Firm—Wegner, Cantor, Mueller & Player

[57] ABSTRACT

An automatic sound volume controller for use with audio equipment mounted on a vehicle adapted that the level of an input audio signal and that of the noises coming inside the cabin in running state are detected, and the difference therebetween is obtained. By use of different gain levels reflecting the level difference, a direct sound signal and an effect sound signal are individually amplified for synthesis. This makes it possible to prevent the added effect sounds from being masked by the running noises because the level of the effect sound signal varies with the noises. As a result, the reproduced sounds supplemented by the effect sounds can be heard clearly while the vehicle is running. With the vehicle in stationary state, the effect sounds are kept from getting excessive, protecting the vehicle passengers from the unpleasant sensation conventionally associated with the apparatus of this kind.

1 Claim, 2 Drawing Sheets

AUTOMATIC SOUND VOLUME CONTROLLER

BACKGROUND OF THE INVENTION:

1. Field of the Invention

The present invention relates to an automatic sound volume controller for use with an on-vehicle audio equipment.

2. Description of the Related Art

Inside a running vehicle, the operator feel as if the reproduced sounds from speakers of the onboard audio equipment were reduced in volume. This phenomenon is caused by the masking of the sounds by the noises coming into the cabin in running state.

A typical solution to the lowered sound volume inside the cabin is to add effect sounds such as a simulated reflection to the sounds reproduced by the onboard audio equipment. Because the level of the effect sounds is lower than that of the direct sounds from the speakers, the added effect sounds still tend to be masked by the noises emanating from the vehicle that is running. This negates the objective in adding the sound effects to the audio signal.

Raising the level of the effect sounds in advance has failed to solve the problem. The reason is that whenever the vehicle comes to a temporary stop on the road, the passengers inside get an unpleasant acoustic sensation from the excessively added effect sounds.

SUMMARY OF THE INVENTION

It is therefore an object of the present invention to provide an automatic sound volume controller which protects added effect sounds from being masked by the noises coming into the cabin in state and which allows the reproduced sounds from the speakers to be heard naturally when the vehicle temporarily stops on the road.

The automatic sound volume controller embodying the present invention comprises a means for detecting the level of an audio signal obtained in onboard audio equipment; a means for detecting the level of the noises coming into the cabin in running state; a control signal generating means which generates a control signal by computing in accordance with the audio signal level and running noise level; a first gain variable amplifying means which amplifies the audio signal using a gain determined by the control signal; an effect sound generating means which generates an effect sound signal on the basis of the audio signal; a second variable amplifying means which amplifies the effect sound signal using a gain determined by the control signal; and an adding means which adds output signals to each other from the first and the second variable amplifying means for output. Constructed as outlined, the automatic sound volume controller detects the level of the audio signal coming direct from the onboard audio equipment and that of the running noises, amplifies individually the audio (direct sound) signal and the effect sound signal with a gain determined by the difference between the two levels, and mix the amplified signals.

DETAILED DESCRIPTION OF PREFERRED EMBODIMENTS

Figure 1:
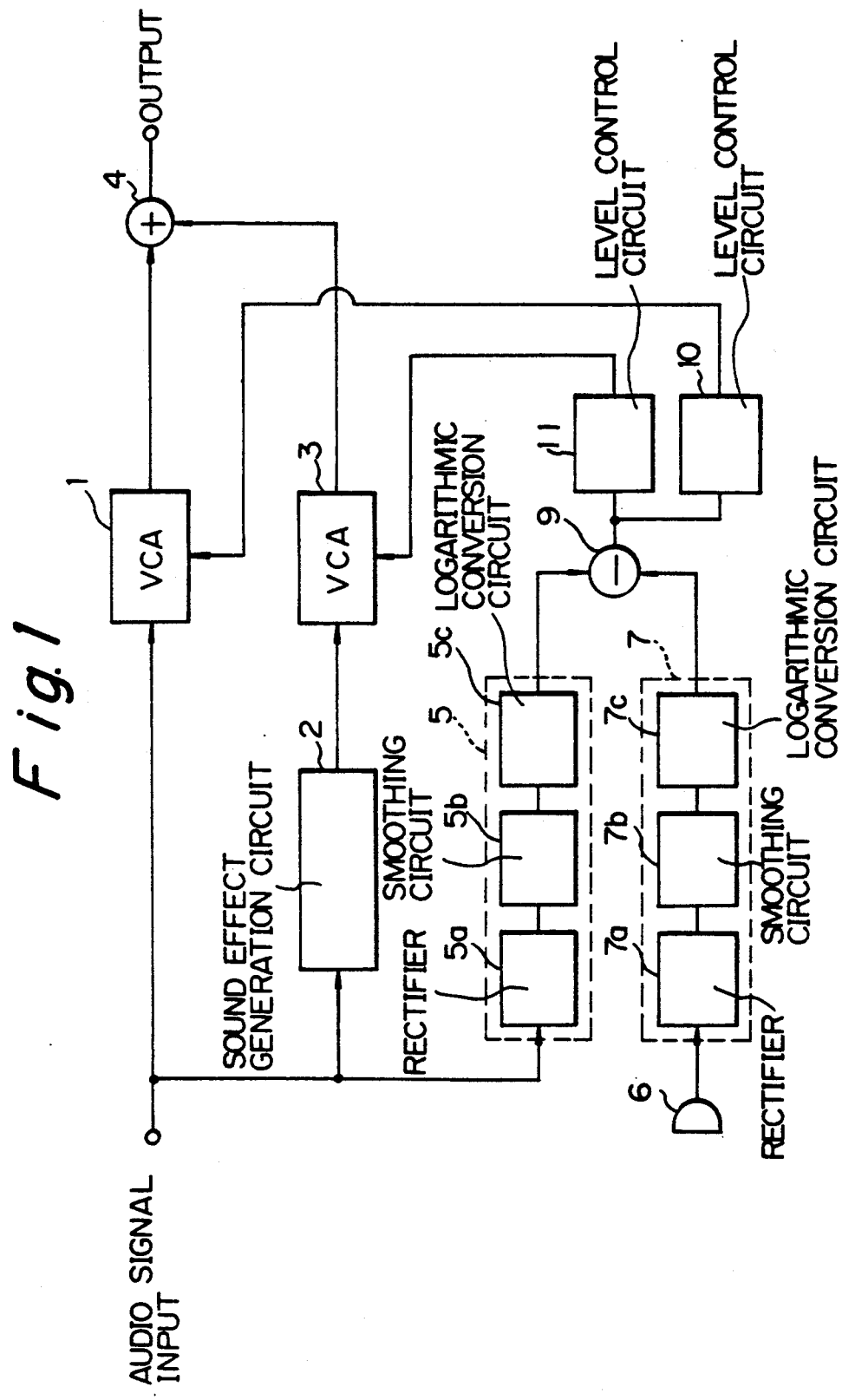
FIG. 1 is a block diagram of a preferred embodiment of the present, invention.

In FIG. 1, an audio signal from an audio signal source such as a tape deck is supplied to a VCA (voltage controlled amplifier) 1 and an effect sound generation circuit 2. The effect sound generation circuit 2 illustratively comprises a plurality of delay elements which delay a input audio signal, an ATT (attenuator) connected to the output of each delay element, and an adder that adds the output levels of the ATTs. The effect sound circuit 2 generates a reflected sound signal as an effect sound signal. A VCA 3 is connected to the output of the effect sound generation circuit 2. The output levels of the VCAs 1 and 3 are added by an adder 4. The output signal from the adder 4 becomes the output signal of this controller.

The input audio signal is also fed to a signal level detection circuit 5. The signal level detection circuit 5 contains a rectifier 5a which rectifies the input audio signal, a smoothing circuit 5b which smoothes out the rectified signal, and a logarithmic conversion circuit 5c which converts the smoothed signal to a logarithmic value signal. The circuit 5 outputs a DC signal that reflects the level of the input audio signal.

A microphone 6 is disposed inside the vehicle. The output signal of the microphone 6 is supplied to a noise level detection circuit 7. Like the signal level detection circuit 5, the noise level detection circuit 7 comprises a rectifier 7a, a smoothing circuit 7b and a logarithmic conversion circuit 7c.

The output signals from the signal level detection circuit 5 and from the noise level detection circuit 7 are supplied to an arithmetic circuit. This arithmetic circuit has a subtracter 9 and level control circuits 10 and 11. The subtracter 9 computes the difference in output level between the signal detection circuit 5 and the noise level detection circuit 7. The output level of the subtracter 9 is supplied to a control terminal of the VCA 1 via the level control circuit 10, and to a control terminal of the VCA 3 via the level control circuit 11.

In the automatic sound volume controller of the above-described construction, the input audio signal is supplied as a direct sound signal to one of the two input terminals of the adder 4 after being amplified by the VCA 1. The effect sound generation circuit 2 generates a effect sound signal such as a reflected sound signal. The effect sound signal is supplied to the other input terminal of the adder 4 after being amplified by the VCA 3.

The signal level of the input audio signal is detected by the signal level detection circuit 5. The noises of the running vehicle is picked up by the microphone 6. In turn, the signal level of the running noise signal from the microphone 6 is detected by the noise level detection circuit 7. The difference between audio signal level and running noise signal level after their detection is computed by the subtracter 9. The gain of the VCA 1 and that of the VCA 3 vary with the level of the difference signal from computation by the subtracter 9. The level control circuits 10 and 11 are provided so that the gain of the VCA 1 may differ from that of the VCA 3. Adjustments are made manually to become the gain of the VCA 1 greater than that of the VCA 3. For example, when the noise signal level goes up by 10 dB, the direct sound signal is raised by 2 dB and the effect sound signal is raised by 2.5 dB.

Figure 2:
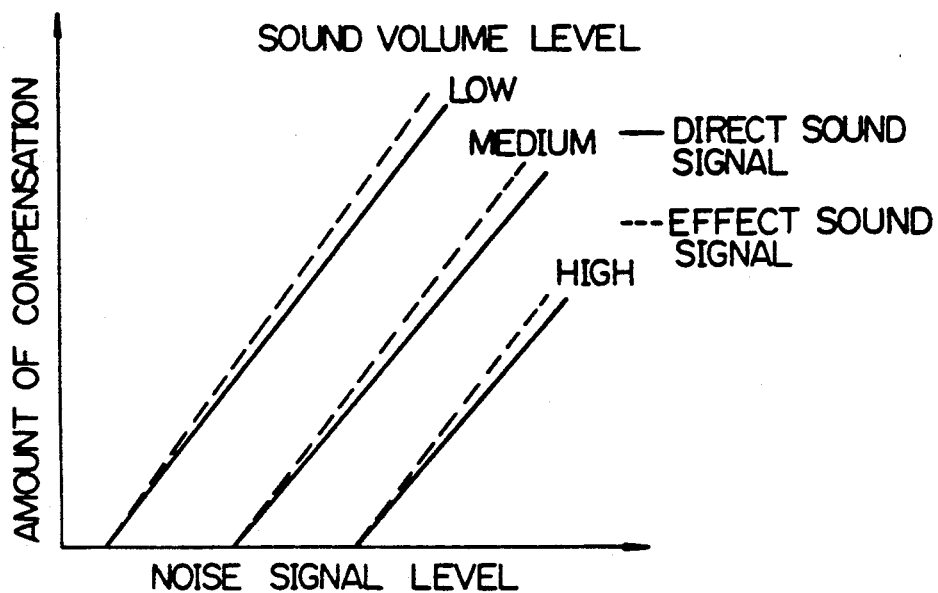
FIGS. 2 and 3 are views showing how much the audio (direct sound) signal and the effect sound signal are compensated with respect to the noise signal level.
Figure 3:
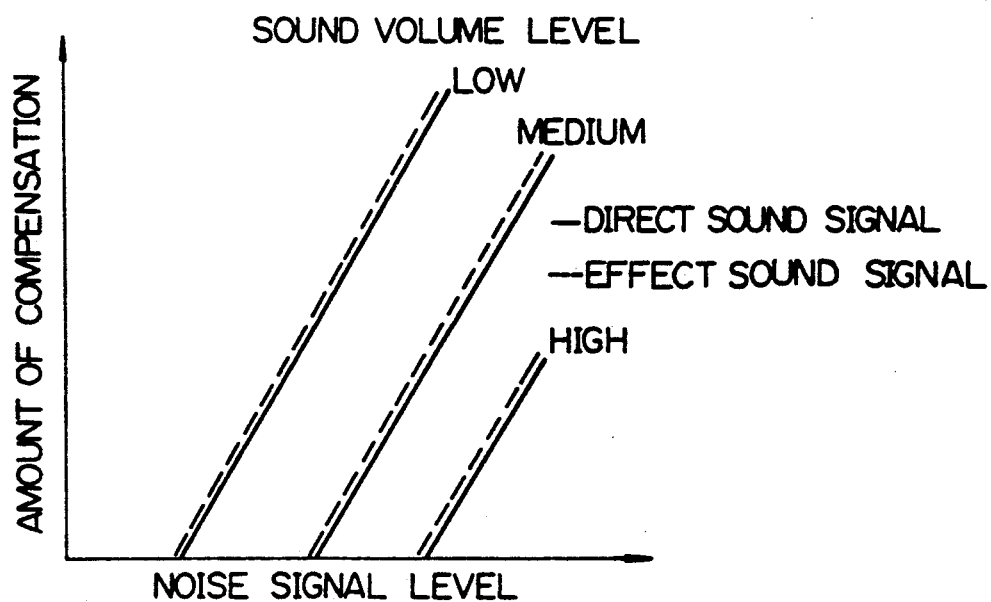

The difference in the amount of compensation by the VCAs 1 and 3 respectively for the direct sound signal and the effect sound signal may either increase in proportion to the noise signal level, as shown in FIG. 2, or remain constant, as shown in FIG. 3, at the high, medium or low sound volume level.

In the automatic sound volume controller for use with audio equipment mounted on the vehicle according to the present invention as described in the foregoing, the audio signal from the sound equipment and the level of the noises coming into the cabin in running state are detected. The detected difference in level is converted to different levels of gain whereby the direct sound signal and the effect sound signal are individually amplified for optimal synthesis. In this manner, even when effect sounds are added to the reproduced sounds, this arrangement prevents masking of the effect sounds caused by the running noises so that the level of the effect sound signal varies with the running noise level. The reproduced sounds added effect sounds can be heard clearly even when the vehicle is running. When the vehicle comes to a stop on the road, the effect sounds are reduced accordingly to prevent the passengers inside from experiencing an uncomfortable acoustic sensation stemming from excessive effect sounds.

What is claimed is:

1. An automatic sound volume controller for use with audio equipment mounted on a vehicle, said controller comprising:

means for detecting the level of an audio signal in said onboard audio equipment;

means for detecting the level of running noise coming into said vehicle in a running state;

control signal generating means for generating a control signal in accordance with a difference in level between said audio signal and said running noise;

first gain variable amplifying means for amplifying said audio signal with a first gain determined by said control signal;

effect sound generating means for generating an effect sound signal on the basis of said audio signal;

second gain variable amplifying means for amplifying said effect sound signal with a second gain determined by said control signal, wherein said second gain is greater than said first gain; and adding means for adding output signals from said first and second gain variable amplifying means.

* * * * *